(12) United States Patent
Kang

(10) Patent No.: US 7,298,213 B2
(45) Date of Patent: Nov. 20, 2007

(54) INPUT IMPEDANCE MATCHING CIRCUIT FOR LOW NOISE AMPLIFIER

(75) Inventor: Sang-Hoon Kang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 242 days.

(21) Appl. No.: 11/224,557

(22) Filed: Sep. 12, 2005

(65) Prior Publication Data

US 2006/0071735 A1    Apr. 6, 2006

(30) Foreign Application Priority Data

Oct. 1, 2004    (KR)    ............... 10-2004-0078161

(51) Int. Cl.
*H03G 3/12* (2006.01)
(52) U.S. Cl. .................. 330/283; 330/302; 330/307; 327/314
(58) Field of Classification Search ........... 330/283, 330/302, 307; 327/314
See application file for complete search history.

(56) References Cited

U.S. PATENT DOCUMENTS

| 4,658,220 | A  | * | 4/1987  | Heston et al. ............ 330/277 |
| 6,204,608 | B1 | * | 3/2001  | Song et al. ............ 315/169.3 |
| 6,400,204 | B1 |   | 6/2002  | Davis |
| 6,674,337 | B2 | * | 1/2004  | Hashemi et al. ............ 333/32 |
| 6,917,815 | B2 | * | 7/2005  | Hajimiri et al. ......... 455/552.1 |
| 7,123,899 | B1 | * | 10/2006 | Chen et al. .............. 455/341 |
| 7,157,972 | B2 | * | 1/2007  | Hajimiri et al. ........... 330/277 |
| 2003/0107056 | A1 | | 6/2003 | Chin et al. |
| 2003/0117206 | A1 | | 6/2003 | Ohnakado |

FOREIGN PATENT DOCUMENTS

| JP | KO0004338 | 6/1992 |
| JP | 11067486  | 9/1999 |

OTHER PUBLICATIONS

English Abstract of Korean Publication No.: 1992-0004338.
English Abstract***.

* cited by examiner

*Primary Examiner*—Patricia Nguyen
(74) *Attorney, Agent, or Firm*—F. Chau & Assoc., LLC

(57) ABSTRACT

An input impedance matching circuit for a low noise amplifier includes a source pad, a gate pad, an input transistor, a source degeneration inductor and a matching capacitor. The gate pad receives an input signal and the input transistor amplifies the input signal transmitted from the gate pad. The source degeneration inductor electrically coupled to an external ground voltage is adapted for input impedance matching of the low noise amplifier. The source pad is coupled to a source electrode of the input transistor and the matching capacitor is formed between the gate pad and the source pad extending the source pad to be disposed under the gate pad. Accordingly, impedance matching of the low noise amplifier may be facilitated and the gain and noise figure of the low noise amplifier may be improved.

20 Claims, 8 Drawing Sheets

INPUT IMPEDANCE MATCHING CIRCUIT FOR LOW NOISE AMPLIFIER

CLAIM FOR PRIORITY

This application claims priority under 35 USC § 119 to Korean Patent Application No. 2004-78161, filed on Oct. 1, 2004, the contents of which are herein incorporated by reference in its entirety.

BACKGROUND OF THE INVENTION

1. Field of the Invention

The present invention relates to a receiving end of a low noise amplifier, and more particularly to a circuit for electrostatic discharge protection and input impedance matching of the low noise amplifier.

2. Description of the Related Art

Generally, a low noise amplifier having improved noise characteristics is used at a radio frequency (RF) receiver end to amplify a received RF signal. In addition, the low noise amplifier is used for impedance matching between internal elements of the low noise amplifier and an external circuit.

A degeneration inductor is widely used for impedance matching of a low noise amplifier. However, when a degeneration inductor is used for impedance matching of a low noise amplifier, noise figure may be deteriorated due to parasitic capacitance of an electrostatic discharge protection circuit and a bonding pad of the low noise amplifier so that implementing an impedance matching low noise amplifier becomes difficult.

FIGS. 1 and 2 show equivalent circuit diagrams illustrating a receiving end of a conventional low noise amplifier 10.

Referring to FIGS. 1 and 2, the conventional low noise amplifier 10 includes a gate pad PG1, parasitic capacitors C1 and C2, an electro-static discharge protection unit D1, an input transistor M1, a source pad PS1 and a source degeneration inductor L1.

A received RF signal is input to the input transistor M1 through the gate pad PG1 and buffered by the input transistor M1 to be amplified. The electro-static discharge protection unit D1 is used to protect an RF receiver chip RFIC from an external electro-static discharge. As shown in FIG. 2, the parasitic capacitor C1 may be formed between the gate pad PG1 and a substrate SUBSTRATE of the chip RFIC. In addition, the parasitic capacitor C2 may also be formed between a source electrode and a gate electrode of the input transistor M1 during the manufacturing process of a semiconductor.

The source degeneration inductor L1 is used to remove a capacitance component of an impedance value (imaginary impedance) so that only a real impedance component will remain. The source degeneration inductor L1 may be implemented using a bonding wire to couple the source pad PS1 to an external circuit.

The input impedance of the RF receiver chip RFIC seen by the gate pad PG1 may be represented as a function of the capacitance of capacitor C2, the inductance of the source degeneration inductor L1 and the transconductance of the input transistor M1. To provide a target (desired) impedance value having only a real component required by a system, for example, 50 Ω, the capacitance value of the capacitor and the inductance value of the source degeneration inductor L1 may be adjusted to cancel each other. In addition, a matching inductor L2, which may be implemented in a separate chip and coupled to the gate pad PG1, may be used for ease of impedance matching.

As described above, except the capacitance C2 formed between the gate and source electrodes of the input transistor M1, the parasitic capacitance C1 between the substrate and the gate pad PG1 and the parasitic capacitance (not shown) between the substrate and the electrostatic discharge protection unit D1 are not used for impedance matching of the low noise amplifier, causing difficulty in the impedance matching. Moreover, the parasitic capacitance may lower the gain of the low noise amplifier and result in degradation of the noise figure.

SUMMARY OF THE INVENTION

Example embodiments of the present invention provide a low noise amplifier in which parasitic capacitance at a receiving end of the low noise amplifier is used for input impedance matching of the low noise amplifier so that impedance matching may be easily performed and both gain and noise figures of the low noise amplifier may be improved.

In some embodiments of the present invention, there is provided an input impedance matching circuit for a low noise amplifier that includes a source pad, a gate pad, an input transistor, a source degeneration inductor and a matching capacitor. The gate pad receives an input signal and the input transistor amplifies the input signal transmitted from the gate pad. The source degeneration inductor coupled to an external ground voltage is adapted for input impedance matching of the low noise amplifier. The source pad is coupled to a source electrode of the input transistor and the matching capacitor is formed between the gate pad and the source pad by extending the source pad to be disposed under the gate pad. Accordingly, impedance matching of the low noise amplifier may be facilitated and the gain and noise figure of the low noise amplifier may be improved.

In one embodiment, the input impedance matching circuit may further include an electro-static discharge protection unit disposed between the gate pad and an internal ground voltage, configured to protect the low noise amplifier from an external electro-static discharge.

In another embodiment, the input impedance matching circuit may further include a first electro-static discharge protection unit disposed between the gate pad and the source pad, for protecting the low noise amplifier from an external electro-static discharge protection and for input impedance matching of the low noise amplifier; and a second electro-static discharge protection unit disposed between the source pad and an internal ground voltage and configured to protect the low noise amplifier from an external electro-static discharge.

In other embodiments of the present invention, there is provided a low noise amplifier that includes a source pad, a gate pad, an input transistor, a load, a source degeneration inductor and a matching capacitor. The gate pad receives an input signal. The input transistor amplifies the input signal transmitted from the gate pad. The load is coupled to a drain electrode of the input transistor. The source degeneration inductor coupled to an external power supply voltage is adapted for input impedance matching of the low noise amplifier. The source pad is coupled to a source electrode of the input transistor. The matching capacitor is formed between the gate pad and the source pad by extending the source pad to be disposed under the gate pad.

In yet another embodiment, the low noise amplifier may further include an electro-static discharge protection unit disposed between the gate pad and an internal ground voltage, which is adapted for protecting the low noise amplifier from an external electro-static discharge.

In still another embodiment, the low noise amplifier may further include a first electro-static discharge protection unit disposed between the gate pad and the source pad, which is adapted for protecting the low noise amplifier from an external electrostatic discharge and input impedance matching of the low noise amplifier; and a second electro-static discharge protection unit disposed between the source pad and an internal ground voltage, configured to protect the low noise amplifier from an external electrostatic discharge.

BRIEF DESCRIPTION OF THE DRAWINGS

The present invention will become more apparent by describing in detail exemplary embodiments thereof with reference to the attached drawings, wherein like elements are represented by like reference numerals, which are given by way of illustration only and thus do not limit the exemplary embodiments of the present invention.

DESCRIPTION OF THE EXEMPLARY EMBODIMENTS

Hereinafter, the present invention will be explained in detail with reference to the accompanying drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

The terminology used herein is for the purpose of describing particular embodiments only and is not intended to be limiting of the invention.

Figure 3:
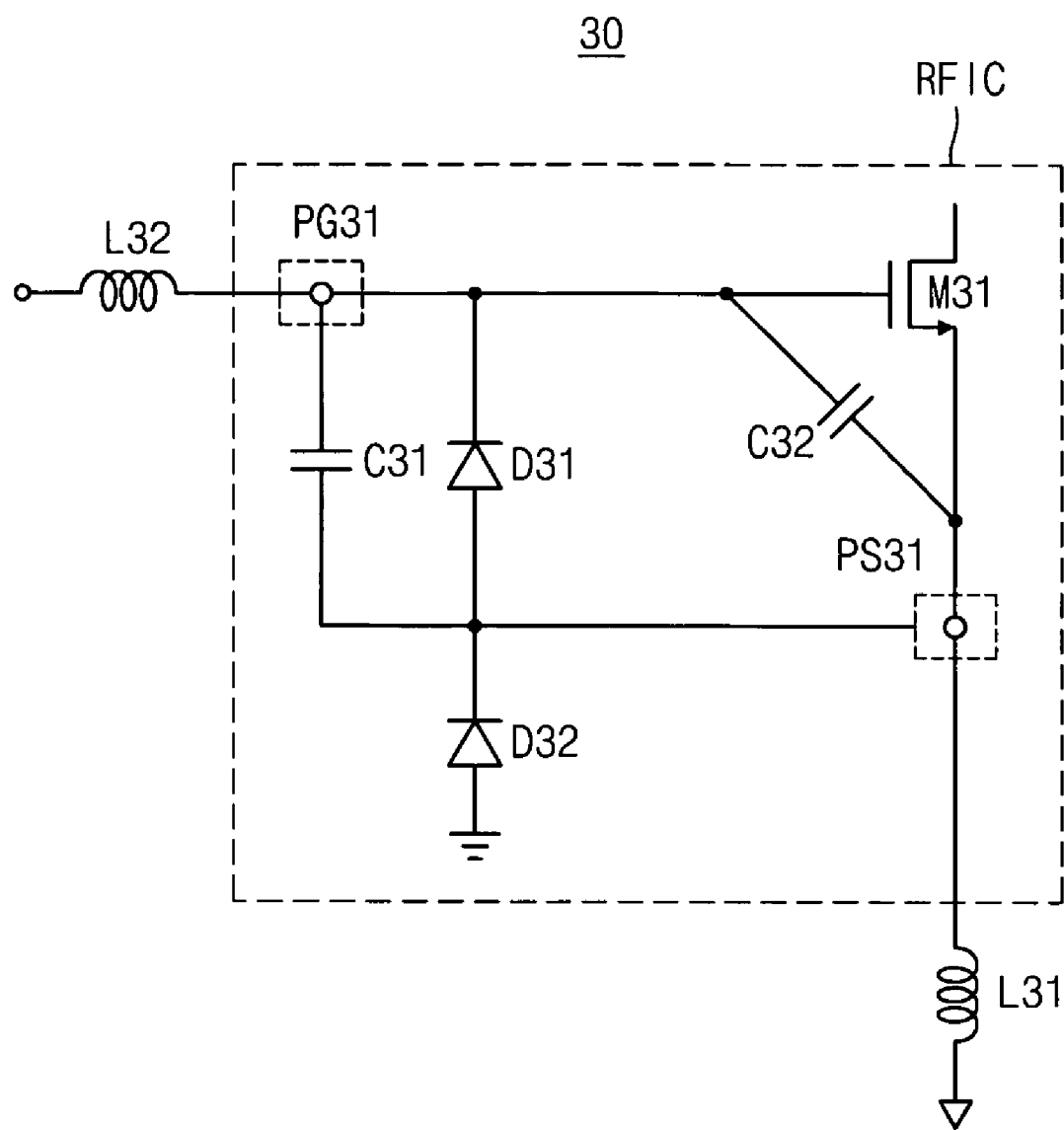
FIG. 3 shows an equivalent circuit diagram illustrating a receiving end of a low noise amplifier according to an exemplary embodiment of the present invention.

FIG. 3 shows an equivalent circuit diagram illustrating a receiving end of a low noise amplifier 30 according to an exemplary embodiment of the present invention.

Referring to FIG. 3, the low noise amplifier 30 includes a gate pad PG31, a matching capacitor C31, first and second electrostatic discharge protection units D31 and D32, an input transistor M31, a source pad PS31 and a source degeneration inductor L31.

A received RF signal is input to the input transistor M31 through the gate pad PG31 and buffered by the input transistor M31 to be amplified. Various types of load (not shown) may be coupled to a drain terminal of the input transistor M31 to configure the low noise amplifier.

Figure 1:
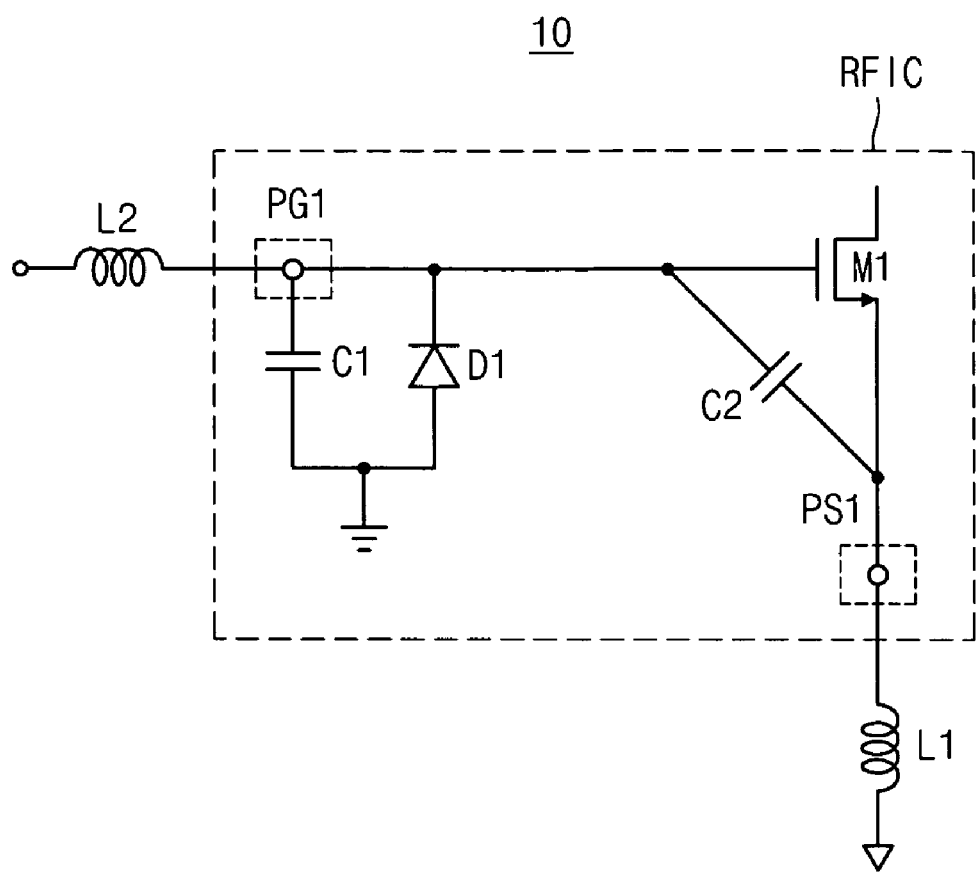
FIGS. 1 and 2 show equivalent circuit diagrams illustrating a receiving end of a conventional low noise amplifier.
Figure 2:
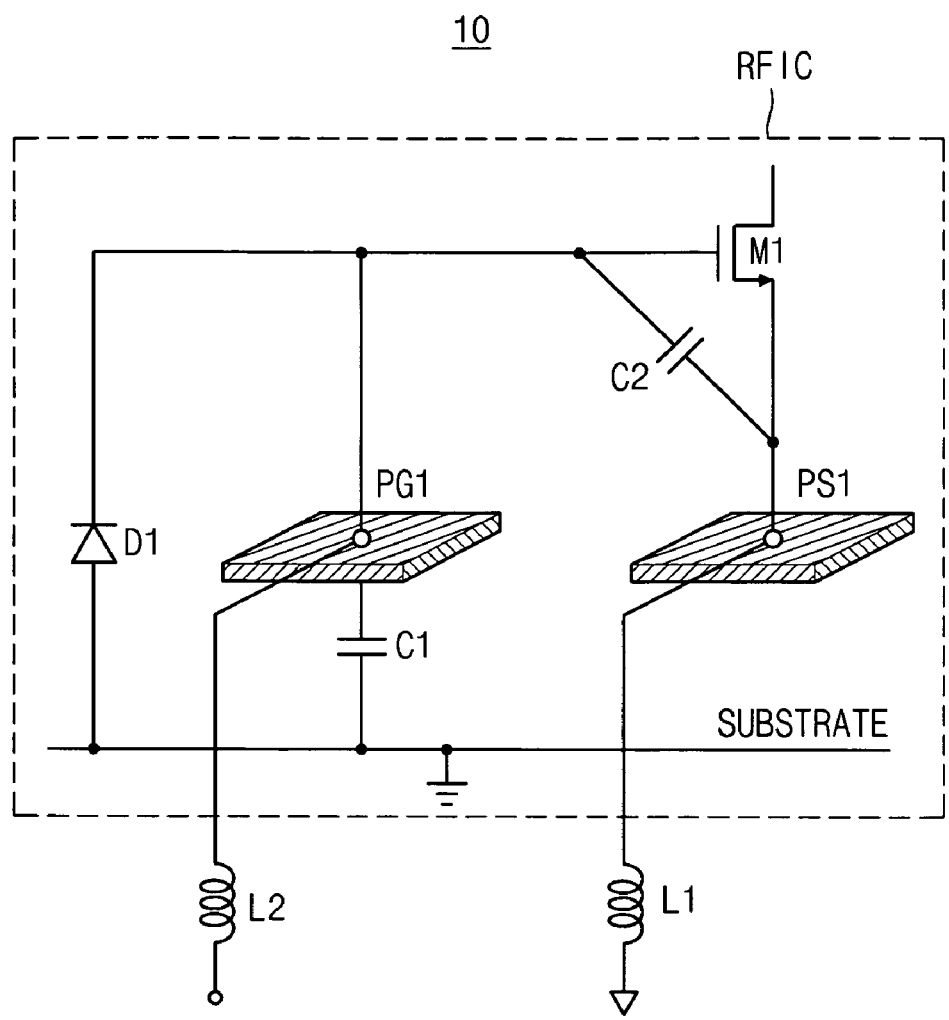

Compared with the prior art shown in FIG. 1, the matching capacitor C31 and the first electro-static discharge protection unit D31 are disposed between the gate pad PG31 and the source pad PS31 and used for impedance matching together with a parasitic capacitance C32 generated during a manufacturing process of the input transistor M31. Because the parasitic capacitance C32 and the transconductance of the input transistor M31 are relevant to the characteristics of the input transistor M31, using only the transconductance of the input transistor M31 and the parasitic capacitor C32 for the impedance matching has some limitations. Therefore, according to an exemplary embodiment of the present invention, the parasitic capacitance C31 and the impedance of the first electro-static discharge protection unit D31 may be used to perform more precise impedance matching.

The first electro-static discharge protection unit D31 may be implemented as a junction diode using a transistor. The first electro-static discharge protection unit D31 transmits an external electro-static discharge to the second electro-static discharge protection unit D32. Additionally, the first electro-static discharge protection unit D31 provides a junction capacitance between the gate and source electrodes of the input transistor M31.

The second electro-static discharge protection unit D32 may also be implemented as a junction diode and coupled to a ground voltage of the substrate to protect the RF receiver chip RFIC from the electro-static discharge.

The source degeneration inductor L31 is used to remove a capacitance component of an impedance value (imaginary impedance) so that only a real impedance component may remain. The source degeneration inductor L31 may be implemented using a bonding wire to couple the source pad PS31 to an external circuit. In addition, a matching inductor L32 having a large inductance and exterior to the RF receiver chip RFIC may be coupled to the gate pad PG31.

Figure 4:
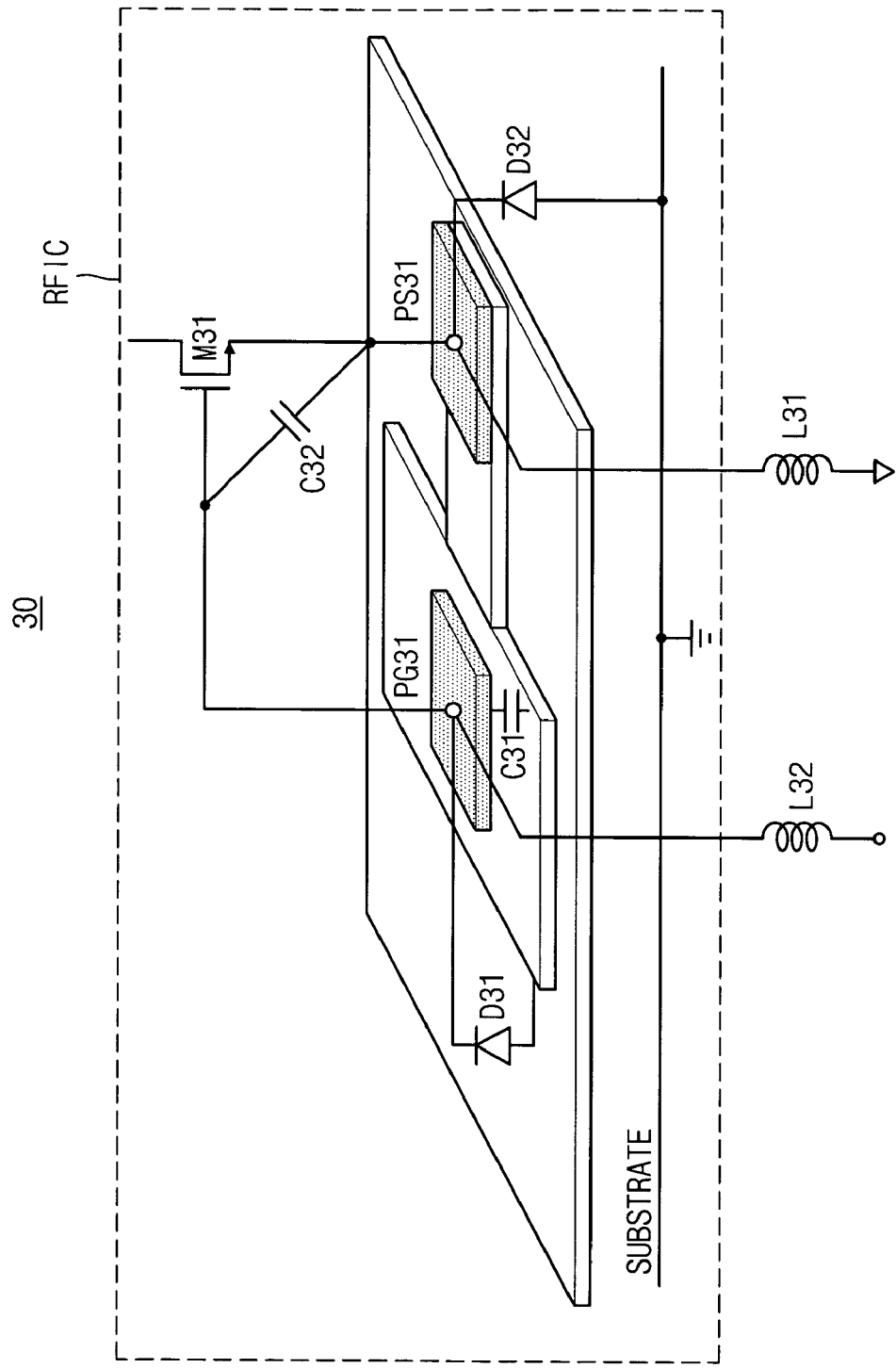
FIG. 4 is a schematic diagram illustrating the receiving end of the low noise amplifier in FIG. 3.
Figure 5:
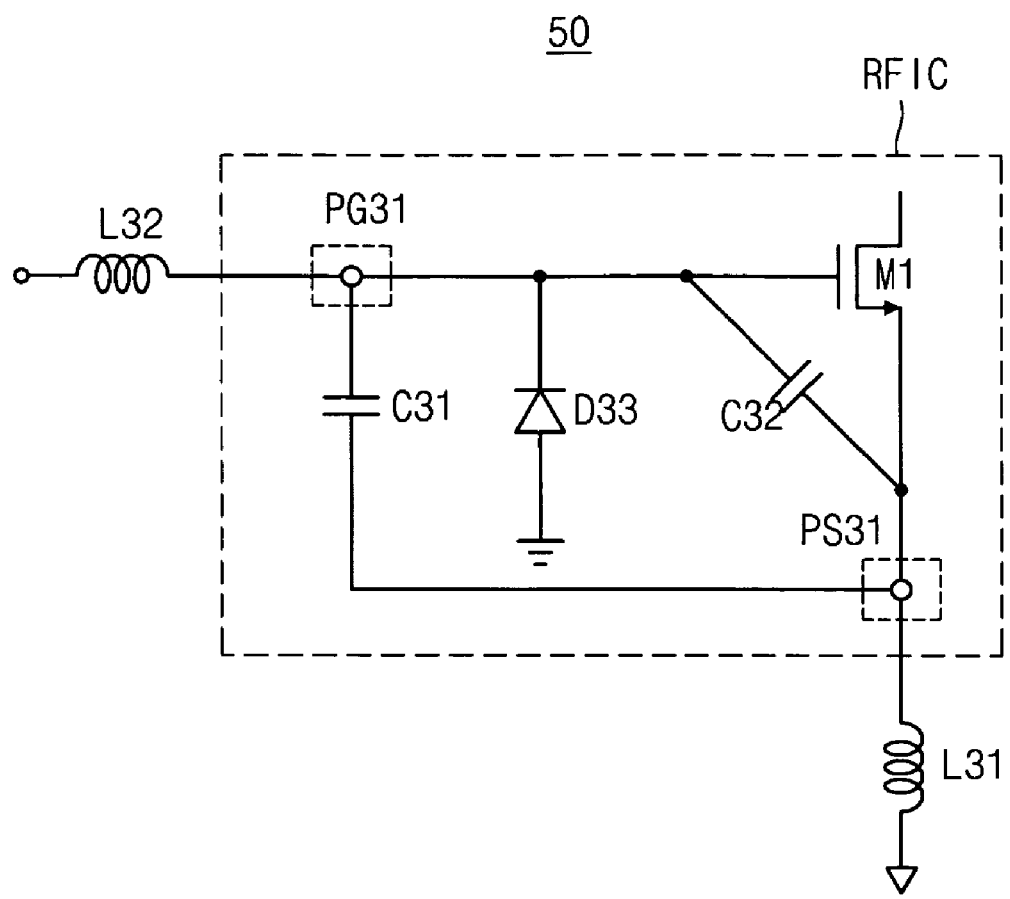
FIG. 5 shows an equivalent circuit diagram illustrating a receiving end of a low noise amplifier according to another exemplary embodiment of the present invention.

Since the matching inductor L32 has an inductance much larger than the inductance of the source degeneration inductor L31, an inductor formed between the gate pad PG31 and the matching inductor L32 by a wire bond is omitted throughout FIGS. 3 to 5.

In addition, a third electro-static discharge protection unit (not shown) coupled to the gate pad PG31 as a supply voltage may further be included in the low noise amplifier 30.

FIG. 4 is a schematic diagram illustrating the receiving end of the low noise amplifier 30 in FIG. 3.

Referring to FIG. 4, the source pad P31 may extend under the gate pad PG31 via, for example, a metal line, so that the matching capacitor C31 may be positioned between the gate pad PG31 and the source pad P31. The first electro-static discharge protection unit D31 is also positioned between the gate pad PG31 and a portion of the source pad extension PS31 under the gate pad PG31. The second electro-static discharge protection unit D32 is formed between the source pad PS31 and a substrate SUBSTRATE.

In addition, to ensure the proper operation of each circuit device that has an impedance value including a capacitance component, a shielding and grounding voltage line (not shown) may be disposed under the first electro-static discharge protection unit D31, the matching capacitor C31, the gate pad PG31 and the source pad PS31 for securing an insulation from the substrate SUBSTRATE.

FIG. 5 shows an equivalent circuit diagram illustrating a receiving end of a low noise amplifier 50 according to another exemplary embodiment of the present invention.

Comparing the low noise amplifier 50 in FIG. 5 with the low noise amplifier 30 in FIG. 3 reveals a single difference, i.e., the configuration relevant to the electro-static discharge protection.

Whereas both the matching capacitor C31 and the first electro-static discharge protection unit D31 are used for the input impedance matching in FIG. 3, only the matching capacitor C31 is used for input impedance matching in FIG. 5. The electro-static discharge protection unit D33 is disposed between the gate pad PG31 and the substrate that is coupled to the ground so as to protect the gate pad PG31 from the electro-static discharge.

Thus, as shown in FIGS. 3 and 5, the capacitance of the electro-static discharge protection unit D31 or D33 may be selectively used or may not be used for impedance matching in addition to the capacitance C31 between the gate pad PG31 and the source pad PS31 so that the efficiency in the input impedance matching and in a layout area may be improved.

Figure 6:
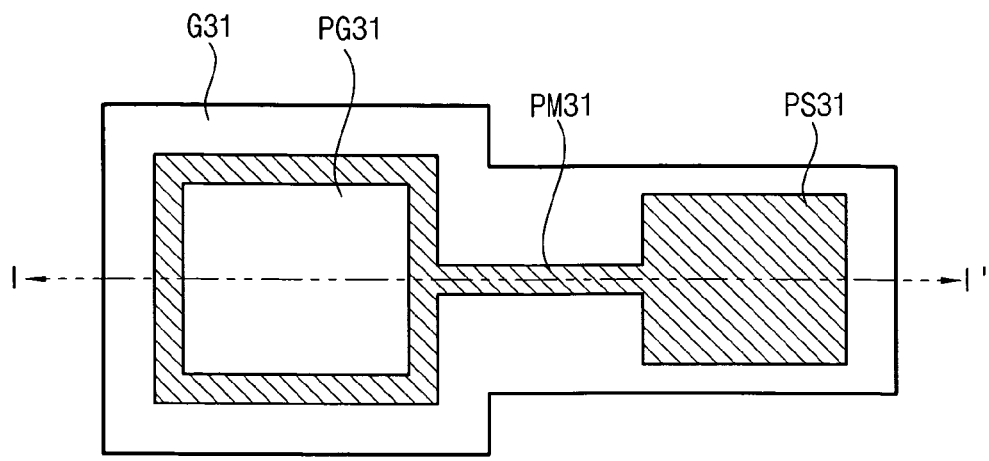
FIG. 6 shows a plan view illustrating a structure of a pad according to an exemplary embodiment of the present invention.
Figure 7:
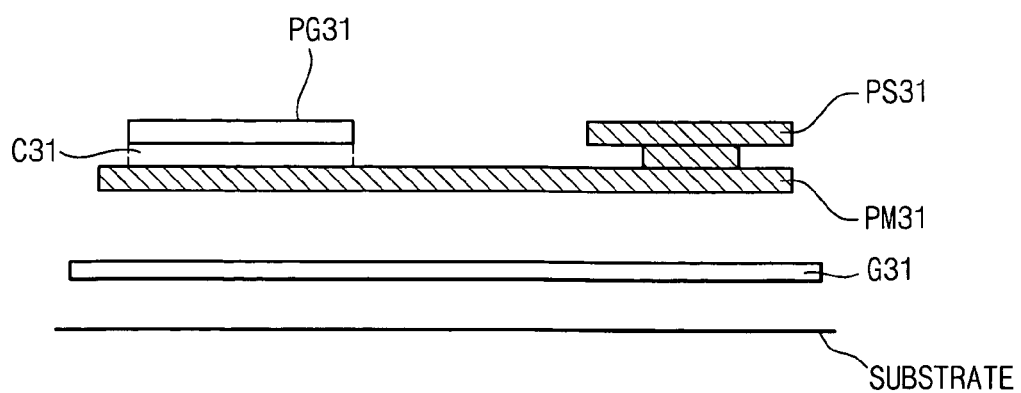
FIG. 7 shows a cross sectional view taken along a line I-I' in FIG. 6.

FIG. 6 shows a plan view illustrating a structure of a pad according to an exemplary embodiment of the present invention and FIG. 7 shows a cross sectional view taken along a line I-I' in FIG. 6. The structure of FIG. 6 may be commonly applied to both of the exemplary embodiments of FIGS. 3 and 5.

As shown in FIG. 7, the source pad PS31 extends under the gate pad PG31 via, for example, a metal line PM31 so that the matching capacitor C31 may be formed between the gate pad PG31 and the source pad PS31. In addition, the gate pad PG31 may be positioned on the source pad extension PM31 that is larger than an area of the gate pad PG31 to increase the capacitance of the matching capacitor C31.

In addition, in order to shield each component of the low noise amplifier (e.g., the gate pad PG31 or the source pad PS31) from the substrate SUBSTRATE, a shielding and grounding voltage line G31 may be disposed under the gate pad PG31 and the source pad PS31.

Figure 8:
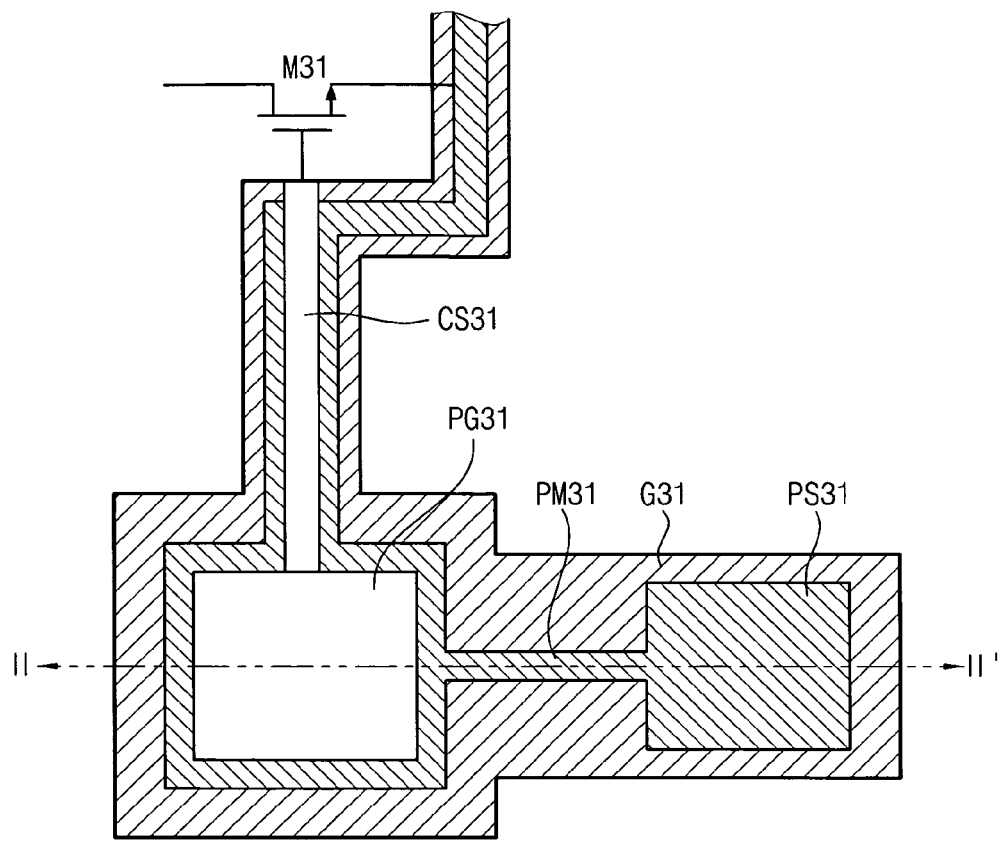
FIG. 8 shows a plan view illustrating a structure of a pad according to another exemplary embodiment of the present invention.
Figure 9:
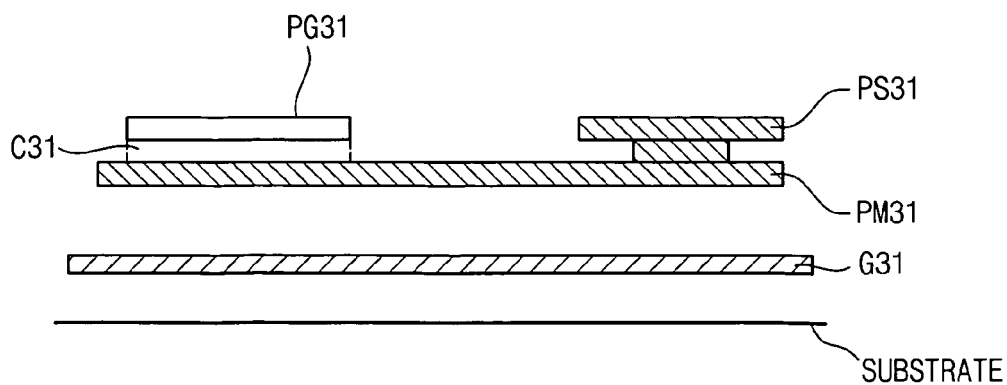
FIG. 9 shows a cross sectional view taken along a line II-II' in FIG. 8.

FIG. 8 shows a plan view illustrating a structure of a pad according to another exemplary embodiment of the present invention and FIG. 9 shows a cross sectional view taken along a line II-II' in FIG. 8.

Referring to FIGS. 8 and 9, the source pad PS31 extends under the gate pad PG31 and also a signal transmission line CS31, through which the gate pad PG31 is electrically coupled to the input transistor M31 to increase the capacitance of the matching capacitor C31.

Figure 10:
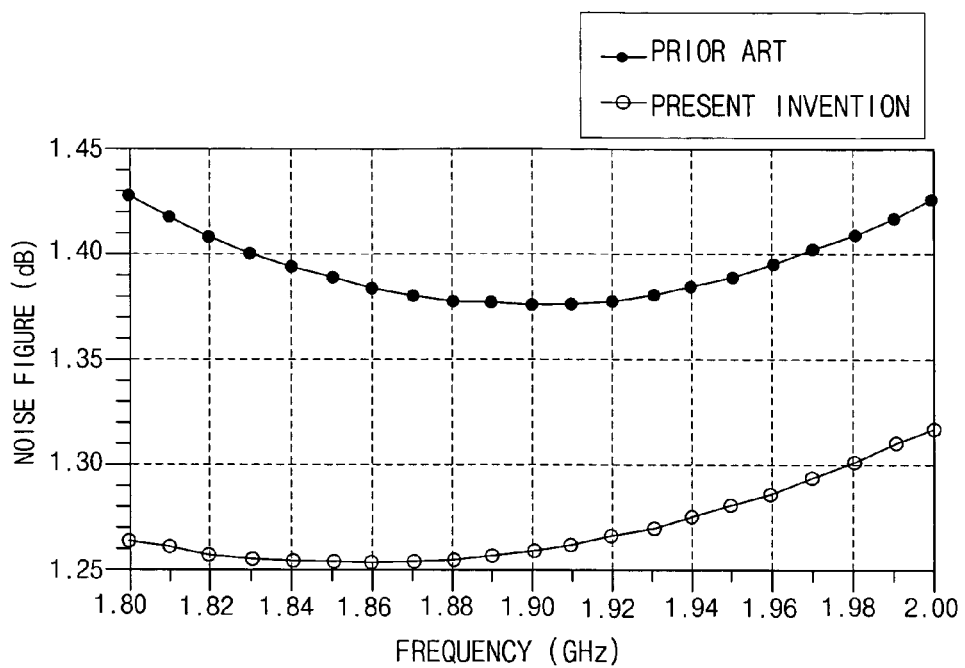
FIG. 10 is a graph showing the noise figure of a low noise amplifier according to an exemplary embodiment of the present invention.
Figure 11:
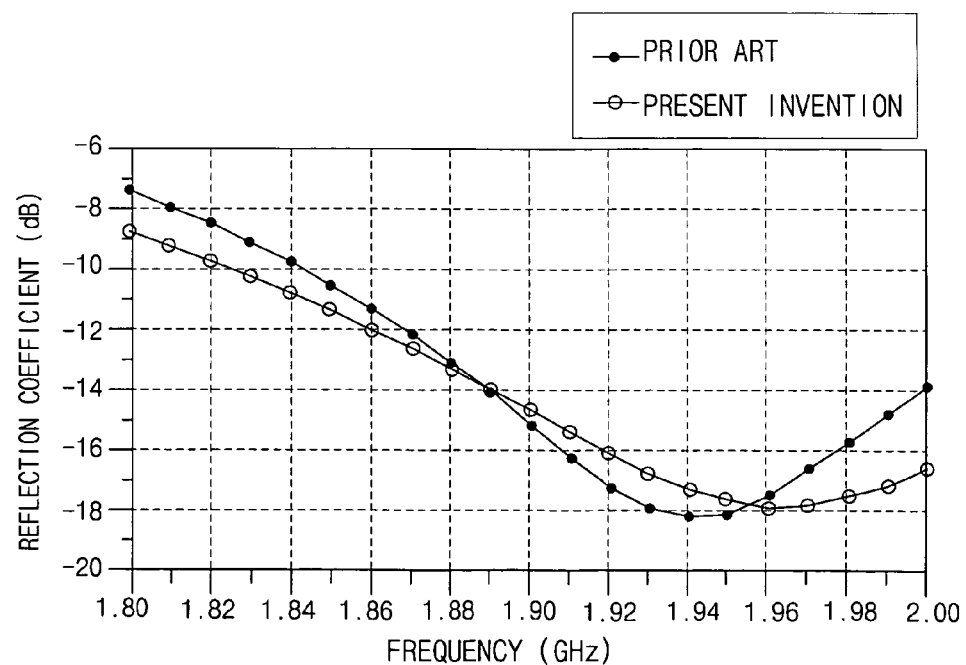
FIG. 11 is a graph showing the reflection coefficient of a low noise amplifier according to an exemplary embodiment of the present invention.

FIGS. 10 and 11 are graphs showing the noise figure and the reflection coefficient of a low noise amplifier, respectively, according to an exemplary embodiment of the present invention.

Referring to FIGS. 10 and 11, the low noise amplifier according to an exemplary embodiment of the present invention exhibits a lower noise figure and has relatively uniform reflection coefficients. For example, under an available certain reflection coefficient such as −16 dB, the reflection coefficients of the low noise amplifier according to an exemplary embodiment of the present invention are more uniform than the prior art. Therefore, the low noise amplifier according to an exemplary embodiment of the present invention may stably operate over a wide frequency band.

As described above, by using the parasitic capacitance for input impedance matching at the receiving end of the low noise amplifier according to the exemplary embodiments of the present invention, the impedance matching of the low noise amplifier may be easily carried out. In addition, the gain and noise figure of the low noise amplifier may be improved.

Having thus described exemplary embodiments of the present invention, it is to be understood that the invention defined by the appended claims is not to be limited by particular details set forth in the above description as many apparent variations thereof are possible without departing from the spirit or scope thereof as hereinafter claimed.

What is claimed is:

1. An input impedance matching circuit for a low noise amplifier, comprising:
   a gate pad configured to receive an input signal;
   an input transistor configured to amplify the input signal transmitted from the gate pad;
   a source degeneration inductor, electrically coupled to an external ground voltage, for matching input impedance of the low noise amplifier;
   a source pad coupled to a source electrode of the input transistor; and
   a matching capacitor formed between the gate pad and the source pad by extending the source pad to be disposed under the gate pad.

2. The circuit of claim 1, further comprising an electro-static discharge protection unit disposed between the gate pad and an internal ground voltage, configured to protect the low noise amplifier from an external electro-static discharge.

3. The circuit of claim 2, wherein the gate pad is disposed above the source pad and is insulated from the source pad.

4. The circuit of claim 3, wherein the source pad extends under the gate pad and a signal transmission line, through which the gate pad is electrically coupled to the input transistor.

5. The circuit of claim 2, further comprising a shielding and grounding voltage line for shielding the source pad and the gate pad from a substrate, wherein the shielding and grounding voltage line is disposed between the source and gate pads and the substrate.

6. The circuit of claim 1, further comprising:
   a first electrostatic discharge protection unit disposed between the gate pad and the source pad, for input impedance matching of the low noise amplifier and protecting the low noise amplifier from an external electrostatic discharge; and
   a second electro-static discharge protection unit disposed between the source pad and an internal ground voltage and configured to protect the low noise amplifier from an external electro-static discharge.

7. The circuit of claim 6, wherein the gate pad is disposed above the source pad, and insulated from the source pad.

8. The circuit of claim 7, wherein the source pad extends under the gate pad and a signal transmission line, through which the gate pad is electrically coupled to the input transistor.

9. The circuit of claim 6, wherein the first and second electrostatic discharge protection units include a junction diode.

10. The circuit of claim 6, further comprising a shielding and grounding voltage line for shielding the source pad and the gate pad from a substrate, wherein the shielding and grounding voltage line is disposed between the source and gate pads and the substrate.

11. A low noise amplifier comprising:
a gate pad configured to receive an input signal;
an input transistor configured to amplify the input signal transmitted from the gate pad;
a load coupled to a drain electrode of the input transistor;
a source degeneration inductor coupled to an external power supply voltage, adapted for input impedance matching of the low noise amplifier;
a source pad coupled to a source electrode of the input transistor; and
a matching capacitor formed between the gate pad and the source pad by extending the source pad to be disposed under the gate pad.

12. The low noise amplifier of claim 11, further comprising an electro-static discharge protection unit for electro-static discharge protection, disposed between the gate pad and an internal ground voltage.

13. The low noise amplifier of claim 12, wherein the gate pad is disposed above the source pad and is insulated from the source pad.

14. The low noise amplifier of claim 13, wherein the source pad extends under the gate pad and a signal transmission line, through which the gate pad is electrically coupled to the input transistor.

15. The low noise amplifier of claim 12, further comprising a shielding and grounding voltage line for shielding the source pad and the gate pad from a substrate, wherein the shielding and grounding voltage line is disposed between the source and gate pads and the substrate.

16. The low noise amplifier of claim 11, further comprising:
a first electro-static discharge protection unit disposed between the gate pad and the source pad, for the input impedance matching of the low noise amplifier and protecting the low noise amplifier from an external electro-static discharge; and
a second electro-static discharge protection unit disposed between the source pad and an internal ground voltage, configured to protect the low noise amplifier from an external electro-static discharge.

17. The low noise amplifier of claim 16, wherein the gate pad is disposed above the source pad, and is insulated from the source pad.

18. The low noise amplifier of claim 17, wherein the source pad extends under the gate pad and a signal transmission line, through which the gate pad is electrically coupled to the input transistor.

19. The low noise amplifier of claim 16, wherein the first and second electro-static discharge protection units include junction diodes.

20. The low noise amplifier of claim 16, further comprising a shielding and grounding voltage line for shielding the source pad and the gate pad from a substrate, wherein the shielding and grounding voltage line is disposed under the source pad and the gate pad for electro-static discharge protection.

* * * * *